United States Patent
Urakawa et al.

(10) Patent No.: US 6,764,747 B2
(45) Date of Patent: Jul. 20, 2004

(54) CIRCUIT BOARD AND METHOD OF PRODUCING THE SAME

(75) Inventors: Toshiya Urakawa, Sodegaura (JP); Youhei Suzuki, Sodegaura (JP); Kunihiro Inada, Sodegaura (JP); Yasuyuki Kawano, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/329,558

(22) Filed: Dec. 27, 2002

(65) Prior Publication Data

US 2003/0129371 A1 Jul. 10, 2003

(30) Foreign Application Priority Data

Dec. 27, 2001 (JP) ........................................ 2001-397528
Aug. 27, 2002 (JP) ........................................ 2002-247483

(51) Int. Cl.$^7$ ............................ B32B 15/00; H05K 1/00; B44C 1/22

(52) U.S. Cl. ........................ 428/209; 428/457; 428/689; 428/901; 428/546; 428/403; 361/748; 361/761; 174/255; 174/256; 174/261; 216/19; 216/39; 216/65; 216/94

(58) Field of Search ................................. 361/748, 761; 174/255–256, 261; 428/209, 901, 457, 689, 546, 403; 216/65, 94, 19, 39

(56) References Cited

FOREIGN PATENT DOCUMENTS

| JP | 07-116870 A | 5/1995 |
| JP | 10-308562 A | 11/1998 |

*Primary Examiner*—Deborah Jones
*Assistant Examiner*—Ling Xu
(74) *Attorney, Agent, or Firm*—Burns, Doane, Swecker & Mathis, L.L.P.

(57) ABSTRACT

A circuit board comprising a resin molded article which includes a metal powder coated by an insulation film and a metal conductor which is formed by metal deposition over a circuit pattern drawn by laser beam irradiation on the surface of the resin molded article through electroless plating, and the method of producing the same.

7 Claims, No Drawings

CIRCUIT BOARD AND METHOD OF PRODUCING THE SAME

BACKGROUND OF THE INVENTION

This invention relates to a circuit board which is obtained by forming a circuit on a board comprising a resin composition as a resin molded article, a metal conductor being able to be formed thereon with strong adhesion to the surface of the resin molded article under a plating process, and method of producing the same.

A resin package with a circuit has been widely known as the name of MID (Molded Interconnect Device) which is produced by forming a conductor circuit on the surface of a two or three dimensionally forming component which is molded by resin. In a general resin molding process, thermoplastic resins including polysulfone (PS), polyethersulfone (PES), polyetherimide (PEI), liquid crystal polymer (LCP), and engineering plastics are used.

The cost reducing requirement for a semiconductor element package including IC, CCD and LD is getting more strict year by year. Therefore, it is expected to develop a new process for a resin component with a three dimensionally forming circuit to realize a surface mounting, miniaturization by micro-circuits, good performances such as high temperature stability, chemical resistance and adhesive property as well as good manufacturing usability and environment and so on. It is particularly required to microfabricate the width of a circuit conductor and a space width between the circuit conductor of the semiconductor package to less than 50 μm for the reason that the degree of a semiconductor's integration has been remarkably improved.

In Japanese Laid-open Patent Publication No. 7(1995)-116870 there is disclosed a method for processing the substrate surface which includes a roughening process thereof by an ultraviolet laser irradiation along the circuit pattern on the board which is formed by a compound of copper powder and resin. According to this process, it is shown that the adhesion of the metal layer to the substrate is improved by the roughening process under the laser beam irradiation because the copper powder, which is hardly removed by an ultraviolet laser, remains thereon. The procedure devised in this publication is to improve the adhesion of the metal film by CVD (chemical vapor deposition) and so on through roughening the substrate surface under an ultraviolet laser irradiation. If this procedure should be applied to the method of forming a circuit by electroplating or electroless plating, however, plating layers grow on unwanted parts owing to a metal which is exposed over the surface through deflashing, which makes it difficult to obtain a constant quality of circuit board for such reasons as: the electrical stability of the resin board is not necessarily substantial; the electric insulation performance of the board may decrease depending on the kind and composition of the electroless plating catalyst; and a short circuit may easily occur by metal migration, if the circuit board is used under high temperature and humidity.

On the other hand, the applicant of this invention provided in Japanese Laid-open Patent Publication No. 10(1998)-308562 a method characterized by the steps of forming a roughened plane with several depressions with a nearly constant pitch by laser beam sweeping and irradiation on at least part of the surface of the resin molded article in the sweeping direction, then forming a metal film by a plating process over said roughened plane. However, this method has an operational problem in that it takes too much processing time in creating a thick plating layer.

SUMMARY OF THE INVENTION

To address the above-noted challenges, it is an object of the present invention to provide a circuit board wherein a circuit is formed on a molded article using a resin composition which is inexpensive and is capable of forming a micro-circuit in desired thickness without difficulty, and method of producing the same.

The present invention provides a circuit board comprising a resin composition molded article which is provided with a metal powder coated with an insulation film (which is removable by a chemical solution) and a resin (which is workable by a laser beam), wherein the resin composition molded article is engraved along a circuit pattern by laser beam irradiation, the insulation film over the metal powder being removed by the chemical solution and a plating process then being conducted, and a method of producing the same.

In the circuit board according to this invention, a circuit pattern is formed by engraving the surface of the resin molded article to remove part of the resin under laser beam irradiation, wherein a metal powder is exposed inside the circuit pattern. Since the surface of the circuit pattern is roughened when it is drawn to be a canal-like form by removing the resin under laser beam irradiation, there creates a good adhesion between this roughened surface and the metal deposited by electroless plating at the origination of metal which is exposed inside the circuit pattern.

The metal powder to be used in this invention, being coated by an insulation film, can not function as an origination for metal deposition in the electroless plating process as long as it is covered by this insulation film.

It is possible, in the circuit board and method of producing the same according to this invention, to remove the insulation film from the metal powder only on the specific part which is engraved by laser beam irradiation. Therefore, a metal conductor can be formed with high selectivity on the circuit pattern which is engraved by laser beam irradiation.

Furthermore, the occurrence of a short circuit between the adjacent metal conductors can be avoided with high accuracy by adjusting the greatest particle size of the metal powder to be used in this invention, so that the particle size has the specific proportional relationship against the minimum width between the circuit conductor of the circuit pattern to be formed.

It is further possible, in the circuit board and method of producing the same according to this invention, to obtain a circuit board with high temperature stability, strong solder crack resistance and excellent chemical resistance because a metal film is formed with a strong adhesion to the resin molded article by filling the roughened groove on the surface of the resin molded article which is formed by a laser beam irradiation with the metal deposition deposited by electroless plating process. It is further possible to obtain a semiconductor device with high temperature stability, solder crack resistance and good chemical resistance by using this circuit board.

It is further possible, according to this invention, to improve the plating speed and plating peel strength by conducting an activation treatment on the surface of the metal powder exposed in the circuit pattern with, for example, palladium and so on.

It is further possible according to this invention to reduce the manufacturing cost of the circuit board by using Cu, Ni, or Cr for the metal powder material, and also to reduce the cost of facility improvement because prior art plating lines can be entirely applied to the line for manufacturing this invention's circuit board.

DESCRIPTION OF THE PREFERRED EMBODIMENTS

The present invention provides a circuit board comprising a resin composition molded article which is provided with a metal powder coated with an insulation film (which is removable by a chemical solution) and a resin (which is workable by a laser beam), wherein the resin composition molded article is engraved along a circuit pattern by laser beam irradiation, the insulation film over the metal powder being removed by the chemical solution and a plating process then being conducted, and a method of producing the same.

The kind of metal powder to be included in the resin molded article of this invention can be of any kind as long as it can act as seeds in a plating process, exemplified by nickel, cobalt, iron, chrome, palladium, copper, silver and gold, being a particle of one of them or a compound of more than one of them. Among them, copper, nickel or chrome is cost-wise preferable.

It is preferable in this invention to use the group of metal powder coated with the above-noted insulation film whose greatest particle size is smaller than the space width between the metal conductors wherein the conductor of the circuit board of this invention is the most thickly concentrated. That is, the size of the metal particle is preferably smaller than the smallest space width between the metal conductors among many other metal conductors formed thereupon (that is, the smallest space width between the metal conductors). What is particularly preferable is the situation wherein the greatest particle size is less than one half, more preferably not more than one third, of the smallest space width between the metal conductors.

Though there is no particular limit to the minimum size of the metal powder particle coated with the insulation film, it is preferable that the ratio of the particles smaller than 1 $\mu$m is 25 weight percent or less, and particularly preferable if the ratio is 10 weight percent or less because particles in the powder group which includes a lot of small-sized particles sometimes agglutinate and form a secondary particle, and because it is hard to deal with if there are so many microscopic particles. The shape of the metal powder is not particularly limited, but spherical type is preferable in light of simplicity in manufacturing and reliability of the insulation film. As might be expected, the above-mentioned preferable particle size means the greatest size. The range of the particle size to cover such condition is generally 2 to 20 $\mu$m, and preferably 3 to 10 $\mu$m. The size of metal powder can be obtained by classifying to the specified size through the use of, for example, the standard sieve, wind powder classifier and so on.

The surface of this metal powder should be covered with an insulation film which should be removable by a chemical solution. As a matter of course, the chemical solution herein should not have a negative impact on the circuit board. The insulation film is preferably a metal oxide film because of its simplicity in producing and removing by a chemical solution, wherein an even insulation layer can be easily formed by oxidizing a metal powder to become an oxide film. It is by necessity possible to form the insulation film over the metal powder with a resin which is soluble in the solvent that does not dissolve the resin comprising the board. There is no problem in this case to remove the insulation film not by the chemical solution processing but by laser beam irradiation. The preferable chemical solution is specifically an acid. The thickness of the insulation film is adequate as long as it can keep the insulation performance, preferably 1 $\mu$m or less, and further preferably within the range of 0.001 $\mu$m to 0.1 $\mu$m considering the capability of removing with ease in the plating process.

Any kind of resin can be applied as long as they are generally used for a circuit board, but heat resistance resin is preferable, exemplified by thermosetting resins such as epoxy resin, polyimide resin, phenolic resin, unsaturated polyester resin and silicone resin as well as thermoplastic resins represented by engineering plastics such as polyphenylene oxide (PPO) and polyphenylene sulfide (PPS). Above all an epoxy resin is preferably used in light of cost and performance, exemplified by o-cresol type, biphenol type, naphthalene type and so on.

The proportion of the metal powder and resin is: 5 to 25 weight percent of metal powder in general, and preferably 10 to 15 weight percent against 100 weight percent of resin composition.

The above resin composition in this invention can include an inorganic filler in order to improve heat resistance and so on. The inorganic filler which is used herein can be detailed by aluminum hydroxide, magnesium hydrate, calcium carbonate, alumina powder, silica powder, boron nitride powder, titanium oxide, silicon carbide powder, glass fiber and alumina fiber, etc.

The inorganic filler like this, in case of using a powdery type, the average particle size of the powdered inorganic filler is 2 to 50 $\mu$m in general and preferably within the range of 5 to 30 $\mu$m (measuring method: laser method). In case of using a fiber type inorganic filler, the fiber length to be used is 25 $\mu$m or less and preferably within the range of 1 to 10 $\mu$m. The inorganic filler to be used herein is inactive to metal deposition in electroless plating and should be a particle with electric insulation performance.

The quantity consumed of the inorganic filler has no particular limit as long as it is sufficient for purposes of the circuit board, but it is generally 95 weight percent or less against 100 weight percent of resin composition, and preferably within the range from 50 weight percent to 85 weight percent.

The resin composition used in this invention can include, in addition to the above-formed ingredients, other additives such as a curing agent, a curing accelerator such as imidazole, ureas or amine compound, a fire retardant such as antimony oxide, a coupling agent and kind of wax.

There is no limit about how to form the molded article, and any desired shape can be made by the ordinary molding methods such as injection molding, extrusion molding, press-forming and so on.

As is obviously known by the construction of this invention, there is no limit to the shape of the circuit board, and any kind of a shape such as box-like shape, flat shape and so on is acceptable.

According to the present invention, the surface of the resin molded article manufactured in the above-mentioned method is covered with resin, and a circuit pattern can be drawn by directly irradiating a laser beam on the resin molded article. However, it may happen that metal powder is exposed over the surface of the resin molded article depending on the forming methods or proportion of resin and metal powder. Such kind of metal powder exposed over the surface can be the origination of metal deposition in the electroless plating process. Therefore, such metal powder exposed over the surface should be preferably removed before drawing the circuit pattern under laser beam irradiation. The chemical solution to be used in this process depends on what kind of metal is comprised in the metal powder: when the metal is a copper, an oxidative acid is preferably used, more specifically, it is effective to process for five to thirty minutes using an aqueous solution of sulfuric acid with the concentration of 2 to 10 weight percent which includes 50 to 200 g sodium persulfate per liter.

The next step is to draw a desired circuit pattern on the molded article under laser beam scanning and irradiation. That is, the surface of the molded article is engraved by laser beam irradiation over the surface of the resin molded article, exposing a metal powder coated by insulation film. The resin is not evenly removed in the engraving process and the resin surface which was irradiated by laser beam becomes roughened. Under those processes, a groove-type circuit pattern is formed by the laser beam scanning (sweeping).

The width and depth of the circuit pattern groove which is formed in the above manner depend on the laser output, spot size and scanning speed and so on, but preferably the greatest groove width is 0.01 to 1 mm and the deepest groove depth is 0.001 to 1 mm.

The scanning speed of the laser beam is 500 to 3,000 mm/min., and preferably 800 to 2,000 mm/min.

The kind of the laser beam to be used in this case is not particularly limited but the excimer laser beam which emits 248 nm wave length of laser beam is preferable. As for the laser beam scanning and irradiation, it is preferable if beam scanning is performed by optical system on a two dimensional plane comprising a high-precision mirror and a HP lens, wherein the focal depth in this processing is preferably 20 to 60 $\mu$m.

Also the pulse time of the laser beam, which irradiates with a pulse, is preferably 10 nS to 30 nS in light of the thermal influence to a work-piece.

The method of determining the beam location under the laser beam scanning and irradiation process in this invention should preferably adopt a synchronous scanning NC control method.

Also spot size of the laser beam differs in each optical system to be used, but preferably is larger than 0.01 mm as a practical extent. There is another method of obtaining a desired pattern of roughened surface by letting the laser beam pass through a negatively patterned glass mask to irradiate and sweep over the surface of the resin molded article.

The laser beam spot size of such an excimer laser is, though it differs in each optical system to be used, for example more than 0.01 mm, which is nearly the same as in the case of the prior YAG laser. The feature of the excimer laser is, however, that the size of fabrication made thereby is nearly as same as the spot size of laser beam because it hardly exerts any thermal effects to a work-piece in its processing.

Therefore, it is possible under such an excimer laser to draw a more refined circuit pattern than YAG laser and so on, which can extremely miniaturize the resin package with a circuit. The width of the circuit pattern which is formed by laser beam is preferably more than 20 $\mu$m and particularly more than 30 $\mu$m in light of the stability in drawing circuit pattern, though the width of the circuit pattern can get thinner far to the same width with the wavelength of the laser beam to be used in a theoretical sense.

It is possible, under the usage of an excimer laser like this, to make a roughened surface only on necessary parts of the micro-circuit so that the roughened planes can make a cyclic pattern.

Further, the resin surface exerted by a sweeping and irradiation process with a laser beam under such condition is selectively engraved and exposes a metal powder. The surface of the metal powder exposing in such condition is still covered with insulation film at this stage. Then the insulation film should be removed since the metal powder can not work as an origination for metal deposition in the electroless plating process.

It is generally in this case to remove the insulation film of the resin molded article by contact with a chemical solution which can elute the insulation film. The chemical solution to be preferably used is one which can selectively remove the insulation film and which does not erode the resin molded article. When an oxide film is used as insulation film, any acid aqueous solution and preferably an inorganic acid aqueous solution can be used. As the inorganic acid aqueous solution, fluorinated acid, hydrochloric acid, sulfuric acid and nitric acid can be exemplified, which can be used either independently or in combination. Sulfuric acid is particularly preferable for usage in this invention. An inorganic acid is preferably used as an aqueous solution. When a sulfuric acid is used as an inorganic acid, the general concentration of the sulfuric acid aqueous solution to be used is 0.5 to 10 weight percent, and preferably 1 to 5 weight percent. The insulation film can be removed in this case by dipping the resin molded article for 0.5 to 10 minutes, preferably for 1 to 5 minutes.

Only the part where a circuit pattern is drawn by this means exposes a metal powder which is not coated with insulation film. Since this metal is active for metal deposition by electroless plating, a metal is deposited at the origination of this metal powder under electroless plating process. The metal which is thus deposited from the electroless plating bath over the metal powder as an origination grows along the circuit pattern drawn by a laser beam to form a seriate metal conductor.

An activation treatment can be exerted on the surface of the metal powder which is exposed over the circuit pattern without insulation film in order to improve the activation of the metal powder and further the adhesion between metal conductor and board resin.

One method for activation treatment can be explained by conducting a surface treatment of the metal powder using palladium or platinum in an electroless plating bath which includes palladium compound and/or platinum coumpound. Palladium is particularly preferable in the present invention.

The palladium compound to be used herein can be either of an organic palladium compound or inorganic palladium compound in this invention. The surface treatment using an electroless plating bath which includes a palladium compound and so on is processed by dipping the resin molded article for about one to ten minutes in the electroless plating bath prepared at the temperature from normal to around 40° C. The surface of the bare metal powder can be coated with palladium and so on by this dipping procedure.

The electroless plating is the way wherein a metal ion in the plating bath is reduced and deposited by a reducer, which can be applied by the well-known methods. As a reducer, borane compound, hydrazine hydrate, formaldehyde, hypophosphite, N,N-diethylglycine, hydrazine sulfate, ascorbic acid and so on are used. PH regulator, buffer, complexing agent, accelerator, stabilizer, modifier may be added if necessary. As a pH regulator, an basic compound such as sodium hydroxide and ammonia, an inorganic acid such as sulfuric acid and hydrochloric acid, and an organic acid such as acetic acid and succinic acid and so on can be used.

As a buffer, phosphate, citrate, tartrate and so on can be used. As a complexing agent, an alkali metal salt of organic acid such as acetic acid, glycolic acid, citric acid and tartaric acid, thioglycolic acid, ammonia, hydrazine, triethanolamine, ethylenediamine, glycin, o-aminophenol and EDTA and so on can be used.

As an accelerator, a succinic acid and so on can be used. As a stabilizer, thiourea, metal cyanide, and acetylacetone, etc. can be used.

As a modifier, NaCN and KCN can be used.

In the circuit board according to the present invention, a metal conductor can be formed by an electroless plating as formed above. This metal conductor can be further reinforced by conducting an electroplating over the metal conductor after the above-mentioned electroless plating.

This electroplating can be conducted in an ordinary electroplating bath under the ordinary conditions of electroplating. Since the part to be electroplated is the rough-surfaced area, the current concentration can be calculated within the area thereof.

According to the present invention which provides a method of producing the circuit board, as formed above, it is possible to produce a circuit board wherein any desired patterns can be drawn. Also if the above-mentioned producing method is applied to the molded article for a semiconductor device package, the circuit board formed by this means can be preferably used as the semiconductor device package with conductor circuit.

The method of producing the circuit board in this invention is not limited to the usage in circuit board but also useful also in forming a good adhesive metal film over the surface of a resin frame.

In the above description heretofore, a flat type of resin molded article is mainly cited in this invention. However, it is not limited to the flat type resin molded article as in the above but also can be applied to a three dimensional-formed resin molded article as well as to an electro-conductive thin film to be formed over the inside plane of a through hole which is pierced through a multilaminate board in the thickness direction in order to form an electrical connection.

EXAMPLES

The present invention is hereinafter illustrated by the following examples. However, it is to be understood that the invention is not intended to be limited to the specific embodiments.

Example 1

Epoxy resin, phenolic resin, metal powder (copper powder), filler and other additives were mixed in the following proportion, then heated and kneaded in a roll at 100° C. temperature to obtain a composition for resin molded article:

o-cresol novolak-type epoxy resin: 100 parts by weight (trade name: EOCN-1020, sold by Nippon Kayaku Co., Ltd., Epoxy equivalence: 199 g/eq)

phenol novolak resin: 45 parts by weight (trade name: H-1, sold by Meiwa Chemical Industry Co., Ltd., OH equivalence: 107 g/eq)

bromine epoxy resin: 27 parts by weight (trade name: BREN-S, sold by Nippon Kayaku Co., Ltd., Epoxy equivalence: 285 g/eq)

spherical fused silica: 600 parts by weight (trade name: FB-74, sold by Denki Kagaku Kogyo Kabushiki Kaisha, average particle size: 30 $\mu$m)

copper powder: 100 parts by weight (greatest particle size 10 $\mu$m, average particle size: 5 $\mu$m, coated by an oxide film with the average thickness of 0.01 $\mu$m)

silane coupling agent: 6 parts by weight (SZ-6083, sold by Dow Corning Toray Silicone Co., Ltd.)

2-methylimidazole: 1 parts by weight carnauba wax: 5 parts by weight carbon black: 3 parts by weight antimony oxide (greatest particle size: 20 $\mu$m): 10 parts by weight The above composition for resin molded article was molded under heat and compression at 180° C. temperature using a press-molding machine to form a flat-type rein molded article with the size of 50 mm×50 mm×5 mm.

Next, fifteen lines of groove-shaped roughened part were formed on the level surface of the flat resin molded article as a pseudo pattern, which are 30 mm long with the widths of line/space 50 $\mu$m/50 $\mu$m, under the laser beam irradiation process conducted by a synchronous scanning NC type excimer laser irradiator with the rated power output of 80 W (using an optical system comprising a HPL lens and a glass mask with its contraction scale multiple 4, whose spot size is about 0.5 mm×2.5 mm) under the following conditions:

frequency: 100 Hz beam scanning speed: 1000 mm/min focal depth: 40 $\mu$m energy output: 1.2 J/cm$^2$ The resin molded article wherein a pseudo pattern (circuit pattern) was drawn by above means was dipped into a sulfuric acid aqueous solution with 3 weight percent concentration at room temperature for three minutes to remove the oxide film over the surface of the copper powder which is exposed on the surface of the pseudo pattern.

Then the above resin molded article was dipped into a copper sulfate based electroless plating bath (sold by Nikko Metal Plating Co., Ltd., NMK series) which was adjusted to the concentration including 16 g copper ion/liter at 25° C. for two hours for conducting an electroless plating process until the thickness of the plating layer became about 10 $\mu$m, to obtain the circuit board.

It is found out, by visually checking the circuit board thus manufactured, that copper was deposited selectively on the part where a circuit pattern was formed under the laser beam irradiation. Also it was found, in conducting continuity test between the copper conductors of the circuit board thus manufactured, that no short circuit occurred between the formed copper conductors. In using a copper powder whose greatest particle size was 50 $\mu$m, the same as the width of the circuit pattern, then a short-circuit was prone to occur between the formed copper conductors.

Example 2

Epoxy resin, phenolic resin, metal powder (copper powder), filler and other additives were mixed in the following proportion, then heated and kneaded in a roll at 100° C. temperature to obtain a material for resin board molded article:

o-cresol novolak-type epoxy resin: 100 parts by weight (trade name: EOCN-1020, sold by Nippon Kayaku Co., Ltd., epoxy equivalence: 199 g/eq)

phenol novolak resin: 45 parts by weight (trade name: H-1, sold by Meiwa Chemical Industry Co., Ltd., OH equivalence: 107 g/eq)

bromine epoxy resin: 27 parts by weight (trade name: BREN-S, sold by Nippon Kayaku Co., Ltd., epoxy equivalence: 285 g/eq)

spherical fused silica: 720 parts by weight (trade name: FB-74, sold by Denki Kagaku Kogyo Kabushiki Kaisha, average particle size: 30 μm)

copper powder: 105 parts by weight (greatest particle size: 10 μm, average particle size: 5 μm, the surface coated with an oxide film with the average thickness of 0.01 μm.)

silane coupling agent: 6 parts by weight (SZ-6083, sold by Dow Corning Toray Silicone Co., Ltd.)

2-methylimidazole: 1 parts by weight carnauba wax: 5 parts by weight carbon black: 3 parts by weight antimony oxide (greatest particle size: 20 μm): 10 parts by weight The above composition for resin molded article was molded under heat and compression at 180° C. temperature using a press-molding machine to form a flat-type rein molded article with the size of 50 mm×50 mm×5 mm.

Then this flat resin molded article was dipped into a wash liquid consisting of a sulfuric acid aqueous solution with the concentration of 5 weight percent, which includes 100 g of sodium persulfate per one liter at room temperature for thirty minutes to fully dissolve and remove the copper powder exposed over the surface of the resin molded article.

Next, fifteen lines of groove-shaped roughened plane as a pseudo pattern (circuit pattern), which are 30 mm long with the widths of line/space 100 μm/100 μm and a line for measuring the adhesion strength of plating to the resin which is 30 mm long with the width of 10 mm were formed on the level surface of thus pre-cleaned resin molded article by the laser beam irradiation process conducted by a synchronous scanning NC type excimer laser irradiator with the rated power output of 80 W (using an optical system comprising a HPL lens and a glass mask with its contraction scale multiple 4, whose spot size is about 0.5 mm×2.5 mm) under the following conditions:

Frequency: 100 Hz beam scanning speed: 1000 mm/min focal depth: 40 μm energy output: 1.2 J/cm$^2$ The resin molded article was then dipped into a sulfuric acid aqueous solution with 3 weight percent concentration at room temperature for three minutes to remove the oxide film over the surface of the copper powder which exposed on the surface of the circuit pattern.

After removing the oxide film over the surface of the copper powder in the circuit pattern, then the above resin molded article was dipped into a copper sulfate based electroless plating bath (sold by Nikko Metal Plating Co., Ltd., NMK series) adjusted to the concentration including 16 g copper ion/liter at 25° C. for two hours for conducting an electroless plating process until the thickness of the plating layer became about 10 μm, to obtain the circuit board.

The resin molded article (circuit board) wherein a copper conductor was formed by an electroless plating process as mentioned above was wet-cleaned and then dried.

It is found out, by visually checking the circuit board thus manufactured, that a copper was deposited selectively on the part where a circuit pattern was formed under the laser beam irradiation but no copper deposition was found on the other parts of the resin molded article. Also it was found, after conducting a continuity test between the copper conductors of the circuit board thus manufactured, that no short circuit occurred between the formed copper conductors. In case the washing process was not conducted with a sulfuric acid aqueous solution including a sodium persulfate before layser beam irradiation, a little copper deposition was sometimes found out even on parts which was not exerted by laser beam irradiation.

As a result of measuring the adhesion strength of copper conductors manufactured by above means to the board by exfoliating the plating layer from the board in the right angle direction, its peel strength was around 0.1 N/mm.

Example 3

Epoxy resin, phenolic resin, metal powder (copper powder), filler and other additives were mixed in the following proportion, then heated and kneaded in a roll mixer at 100° C. temperature to obtain a material for resin board molded article:

o-cresol novolak-type epoxy resin: 100 parts by weight (trade name: EOCN-1020, sold by Nippon Kayaku Co., Ltd., epoxy equivalence: 199 g/eq)

phenol novolak resin: 45 parts by weight (trade name: H-1, sold by Meiwa Chemical Industry Co., Ltd., OH equivalence: 107 g/eq)

bromine epoxy resin: 27 parts by weight (trade name: BREN-S, Nippon Kayaku Co., Ltd., epoxy equivalence: 285 g/eq)

spherical fused silica: 720 parts by weight (trade name: FB-74, sold by Denki Kagaku Kogyo Kabushiki Kaisha, average particle size: 30 μm)

copper powder: 105 parts by weight (greatest particle size: 10 μm, average particle size: 5 μm, the surface coated with an oxide film with the average thickness of 0.01 μm.)

silane coupling agent: 6 parts by weight (SZ-6083, sold by Dow Corning Toray Silicone Co., Ltd.)

2-methylimidazole: 1 parts by weight carnauba wax: 5 parts by weight carbon black: 3 parts by weight antimony oxide (greatest particle size: 20 μm): 10 parts by weight The above composition for resin molded article was molded under heat and compression at 180° C. temperature using a press-molding machine to form a flat-type rein molded article with the size of 50 mm×50 mm×5 mm.

Then this flat resin molded article was dipped into a wash liquid consisting of sulfuric acid aqueous solution with the concentration of 5 weight percent, which includes 100 g of sodium persulfate per one liter at room temperature for thirty minutes to fully dissolve and remove the copper powder exposed over the surface of the resin molded article.

Next, fifteen lines of groove-shaped roughened plane as a pseudo pattern which are 30 mm long with the widths of line/space 100 μm/100 μm and a line for measuring the adhesion strength of plating to the resin which is 30 mm long with the width of 10 mm were formed on the level surface of thus pre-cleaned resin molded article by the laser beam irradiation process conducted by a synchronous scanning NC type excimer laser irradiator with the rated power output of 80 W (using an optical system comprising a HPL lens and a glass mask with its contraction scale multiple 4, whose spot size is about 0.5 mm×2.5 mm) under the following conditions:

Frequency: 100 Hz beam scanning speed: 1000 mm/min focal depth: 40 μm energy output: 1.2 J/cm$^2$ The resin molded article was then dipped into a sulfuric acid aqueous solution with 3 weight percent concentration at room temperature for three minutes to remove the oxide film over the surface of the copper powder which exposed inside the circuit pattern.

Next, this resin molded article was dipped into a palladium chloride (PdCl$_2$) electroless plating bath which was adjusted to the concentration including 0.25 g PdCl$_2$/liter at 35° C. for one minute for conducting an electroless plating process to coat the copper powder on the surface of the circuit pattern with a palladium film with the thickness of 0.001 μm in average.

Then the resin molded article processed by above means was dipped into a copper sulfate based electroless plating bath (sold by Nikko Metal Plating Co., Ltd., NMK series) which was adjusted to the concentration including 16 g copper ion/liter at 25° C. for two hours for conducting an electroless plating process until the thickness of the plating layer became about 10 μm, to obtain the circuit board.

It is found out, by visually checking the circuit board thus manufactured, that a copper was deposited selectively on the part where a circuit pattern was formed under the laser beam irradiation. Also it was found, after conducting a continuity test between the copper conductors of the circuit board thus manufactured, that no short circuit occurred between the formed copper conductors.

As a result of measuring the adhesion strength of copper conductors manufactured by above means to the board by exfoliating the plating layer from the board in the right angle direction, its peel strength was 0.3 N/mm.

Example 4

Epoxy resin, phenolic resin, metal powder (copper powder), filler and other additives were mixed in the following proportion, then heated and kneaded in a roll at 100° C. temperature to obtain a material for resin board molded article:

o-cresol novolak-type epoxy resin: 100 parts by weight (trade name: EOCN-1020, sold by Nippon Kayaku Co., Ltd., epoxy equivalence: 199 g/eq)

phenol novolak resin: 45 parts by weight (trade name: H-1, sold by Meiwa Chemical Industry Co., Ltd., OH equivalence: 107 g/eq)

bromine epoxy resin: 27 parts by weight (trade name: BREN-S, sold by Nippon Kayaku Co., Ltd., epoxy equivalence: 285 g/eq)

spherical fused silica: 720 parts by weight (trade name: FB-74, sold by Denki Kagaku Kogyo Kabushiki Kaisha, average particle size: 30 μm)

copper powder: 150 parts by weight (greatest particle size: 10 μm, average particle size: 5 μm, having on its surface an oxide film with the average thickness of 0.01 μm)

silane coupling agent: 6 parts by weight (SZ-6083, sold by Dow Corning Toray Silicone Co., Ltd.)

2-methylimidazole: 1 parts by weight carnauba wax: 5 parts by weight carbon black: 3 parts by weight antimony oxide (greatest particle size: 20 μm): 10 parts by weight The above composition for resin molded article was molded under heat and compression at 180° C. temperature using a press-molding machine to form a flat-type rein molded article with the size of 50 mm×50 mm×5 mm.

Then this flat resin molded article was dipped into a wash liquid consisting of sulfuric acid aqueous solution with the concentration of 5 weight percent, which includes 100 g of sodium persulfate per one liter at room temperature for thirty minutes to fully dissolve and remove the copper powder exposed over the surface of the resin molded article.

Next, a comb electrode pattern for IPC (A pattern) was formed with the widths of line/space 165 μm/165 μm on the level surface of thus pre-cleaned resin molded article by a laser beam irradiation process conducted by a synchronous scanning NC type excimer laser irradiator with the rated power output of 80 W (using an optical system comprising a HPL lens and a glass mask with its contraction scale multiple 4, whose spot size is about 0.5 mm×2.5 mm) under the following conditions:

frequency: 100 Hz beam scanning speed: 1000 mm/min focal depth: 40 μm energy output: 1.2 J/cm$^2$ The resin molded article was then dipped into a sulfuric acid aqueous solution with 3 weight percent concentration at room temperature for three minutes to remove the oxide film over the surface of the copper powder which exposed on the circuit pattern.

The resin molded article obtained in thus process was dipped into a copper sulfate based electroless plating bath (sold by Nikko Metal Plating Co., Ltd., NMK series) which was adjusted to the concentration including 16 g copper ion/liter at 25° C. for two hours for conducting an electroless plating process until the thickness of the plating layer became about 10 μm, to obtain the circuit board.

It is found out, by visually checking the circuit board thus manufactured, that a copper was deposited selectively on the part where a circuit pattern was formed under the laser beam irradiation.

Then 50 V DC Voltage was continually added to the comb electrodes formed on this circuit board under the condition of 85° C. with 85% humidity, to measure the time-passing change of interelectrode electric resistance.

The results are reported in the following Table 1.

Comparative Example 1

A circuit board was formed by the same method with Example 4 except for using a copper powder which was not coated with oxide film as a substitute for a copper powder coated with oxide film.

Then 50 V DC Voltage was continually added to the comb electrodes on this circuit board thus manufactured, under the condition of 85° C. with 85% humidity, to measure the time-passing change of interelectrode electric resistance.

The results are reported in the following Table 1.

TABLE 1

| Passing Time (Hr) Electric Resistance (Ω/cm) | 0 | 200 | 400 | 600 |
|---|---|---|---|---|
| Example 4 | $1.0 \times 10^{16}$ | $1.5 \times 10^{13}$ | $1.2 \times 10^{13}$ | $1.0 \times 10^{13}$ |
| Comparative Example 1 | $1.0 \times 10^{16}$ | $1.2 \times 10^{10}$ | $1.0 \times 10^5$ | $1.0 \times 10^3$ |

As shown in the above Table 1, it is found as the results of Example 4 and Comparative Example 1 that the electric resistance between the circuit patterns which were formed by using a metal powder uncoated by any insulation film was declining over time.

What is claimed is:

1. A circuit board obtained by engraving a resin composition molded article by laser beam irradiation along a circuit pattern, wherein the resin composition molded article includes a metal powder coated with an insulation film which is removable by a chemical solution and a resin which is workable by a laser beam, removing the insulating film of the metal powder on the engraved part by contacting the chemical solution and then conducting a plating process.

2. The circuit board according to claim 1 obtained by further contacting the molded article with a chemical solution which does not dissolve the resin for removing metal powder on the surface of the molded article before the laser beam irradiation.

3. The circuit board according to claim 1 obtained by further subjecting the metal powder to an activation treatment after the removal of the insulating layer and before the plating process.

4. The circuit board according to claim 1, wherein at least a part of the metal powder remains coated by the insulation film.

5. A method for producing a circuit board comprising steps of: engraving a resin composition molded article under a laser beam irradiation along a circuit pattern, wherein said resin composition molded article includes a metal powder covered with an insulation film and a resin; removing the insulation film which coats said metal powder in the circuit pattern by a chemical solution; and then plating.

6. The method according to claim 5, wherein the molded article is contacted with a chemical solution for removing metal powder on the surface of the molded article before the laser beam irradiation.

7. The method according to claim 5, wherein the metal powder whose insulation film is removed is subjected to an activation treatment before plating.

* * * * *